(12) United States Patent
Bakalski et al.

(10) Patent No.: US 9,742,400 B2
(45) Date of Patent: Aug. 22, 2017

(54) SYSTEM AND METHOD FOR DRIVING RADIO FREQUENCY SWITCH

(71) Applicant: Infineon Technologies AG, Neubiberg (DE)

(72) Inventors: Winfried Bakalski, Munich (DE); Anton Steltenpohl, Munich (DE); Hans Taddiken, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/705,518

(22) Filed: May 6, 2015

(65) Prior Publication Data

US 2016/0329891 A1 Nov. 10, 2016

(51) Int. Cl.
*H03K 17/693* (2006.01)
*H03K 17/687* (2006.01)
*H03K 17/16* (2006.01)

(52) U.S. Cl.
CPC .................................. *H03K 17/693* (2013.01)

(58) Field of Classification Search
CPC ....... H03K 17/687; H03K 17/102; H03F 3/72
USPC .................................................. 327/365–508
See application file for complete search history.

(56) References Cited

U.S. PATENT DOCUMENTS

| | | | | |
|---|---|---|---|---|
| 4,929,855 A * | 5/1990 | Ezzeddine | ........... | H03K 17/102 327/427 |
| 6,803,680 B2 * | 10/2004 | Brindle | ............... | H01L 27/0203 257/E27.016 |
| 8,008,988 B1 * | 8/2011 | Yang | .................... | H03K 17/693 333/101 |
| 8,395,435 B2 * | 3/2013 | Cassia | ...................... | H03F 3/72 327/436 |
| 8,461,903 B1 * | 6/2013 | Granger-Jones | ....... | H03K 17/04 327/427 |
| 8,786,002 B2 * | 7/2014 | Kondo | ..................... | H04B 1/48 257/296 |
| 9,214,922 B2 * | 12/2015 | Granger-Jones | ........ | H03J 5/246 |
| 9,438,223 B2 * | 9/2016 | de Jongh | ............. | H03K 17/161 |
| 2008/0111618 A1 * | 5/2008 | Kao | ..................... | H03F 3/45475 330/9 |
| 2008/0265997 A1 | 10/2008 | Berroth et al. | | |

(Continued)

FOREIGN PATENT DOCUMENTS

CN            103986450             8/2014

OTHER PUBLICATIONS

Battjes, C., "A Wide-Band High-Voltage Monolithic Amplifier," IEEE Journal of Solid-State Circuits, vol. SC-8, No. 6, Dec. 1973, pp. 408-413.

(Continued)

*Primary Examiner* — Brandon S Cole
(74) *Attorney, Agent, or Firm* — Slater Matsil, LLP

(57) ABSTRACT

In accordance with an embodiment, a radio frequency (RF) switching circuit includes a plurality of series connected RF switch cells comprising a load path and a control node, a plurality of first gate resistors coupled between control nodes of adjacent RF switch cells, and an input resistor having a first end coupled to a control node of one of the plurality of RF switch cells and a second end configured to an output of a switch driver. Each of the plurality of series connected RF switch cells includes a switch transistor.

23 Claims, 11 Drawing Sheets

Switching time for parallel devices

(56) References Cited

U.S. PATENT DOCUMENTS

| | | | | |
|---|---|---|---|---|
| 2011/0260780 A1* | 10/2011 | Granger-Jones | ..... | H03K 17/102 |
| | | | | 327/537 |
| 2011/0316062 A1* | 12/2011 | Kondo | ..... | H04B 1/48 |
| | | | | 257/312 |
| 2013/0321061 A1* | 12/2013 | Chen | ..... | H03K 17/16 |
| | | | | 327/382 |
| 2014/0118053 A1* | 5/2014 | Matsuno | ..... | H03K 17/161 |
| | | | | 327/427 |
| 2015/0236691 A1* | 8/2015 | Cam | ..... | H03K 17/687 |
| | | | | 343/876 |
| 2015/0326207 A1 | 11/2015 | Yu et al. | | |

OTHER PUBLICATIONS

Liu, G., "Fully Integrated CMOS Power Amplifier," Electrical Engineering and Computer Sciences, University of California at Berkeley, Technical Report No. UCB/EECS-2006-162, htt://eecs.berkeley.edu/Pubs/TechRpts/2006EECS-2006-162.html, Dec. 6, 2006, 192 pgs.

\* cited by examiner

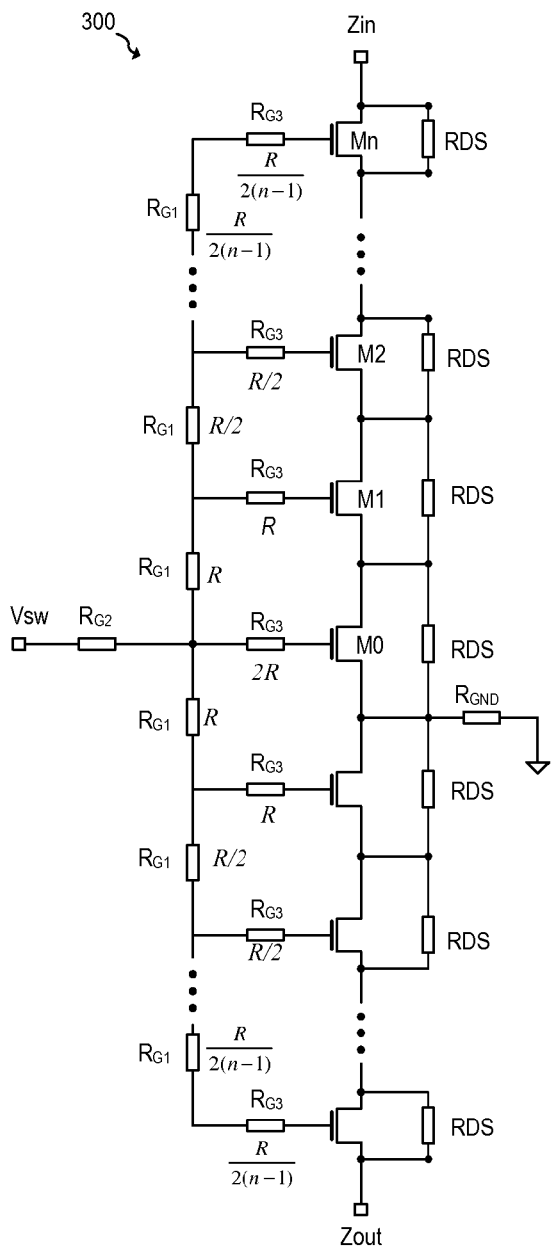
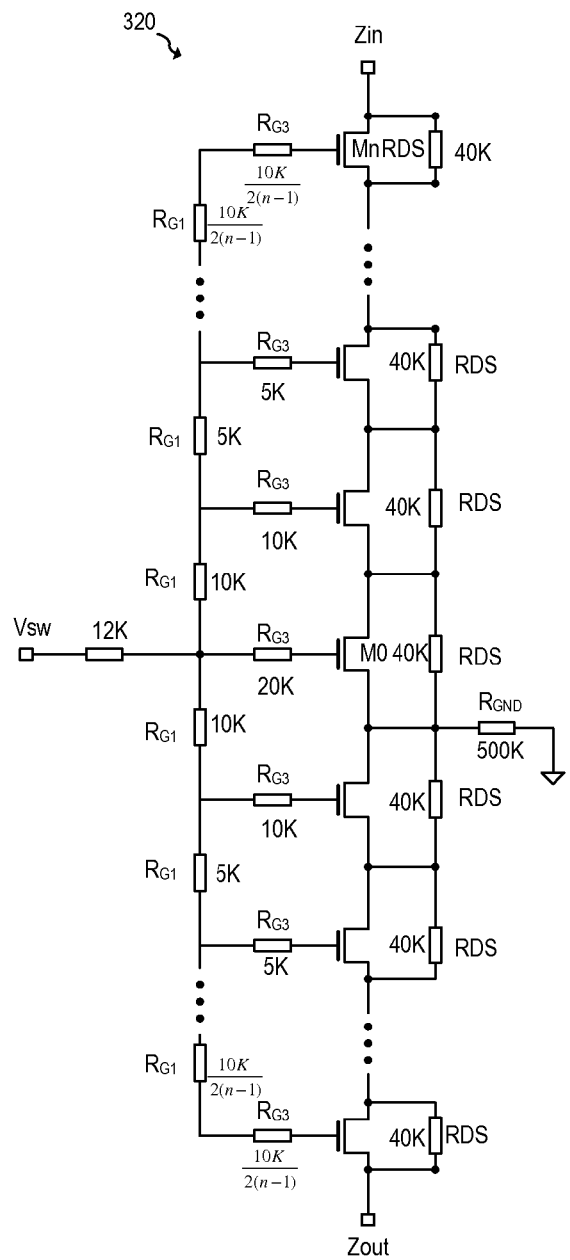
*FIG. 3a*  *FIG. 3b*

FIG. 4a  Switching time for parallel devices
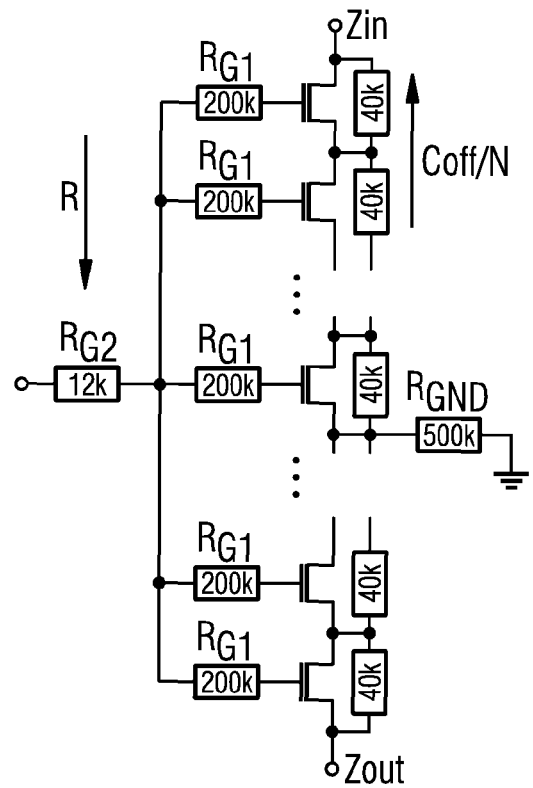
FIG. 4b
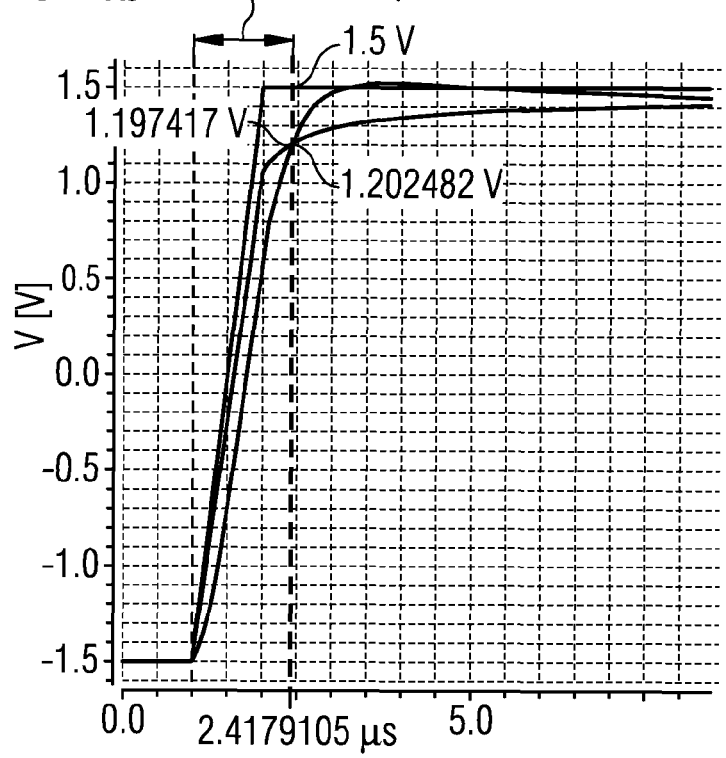

FIG. 4c  Switching time for series devices
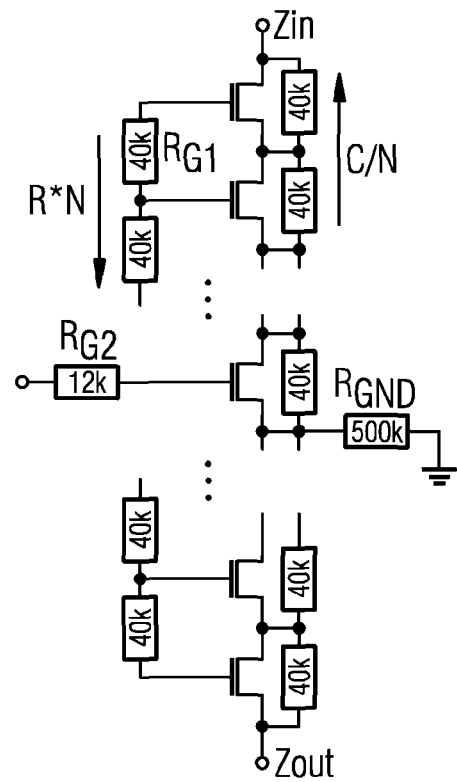
FIG. 4d
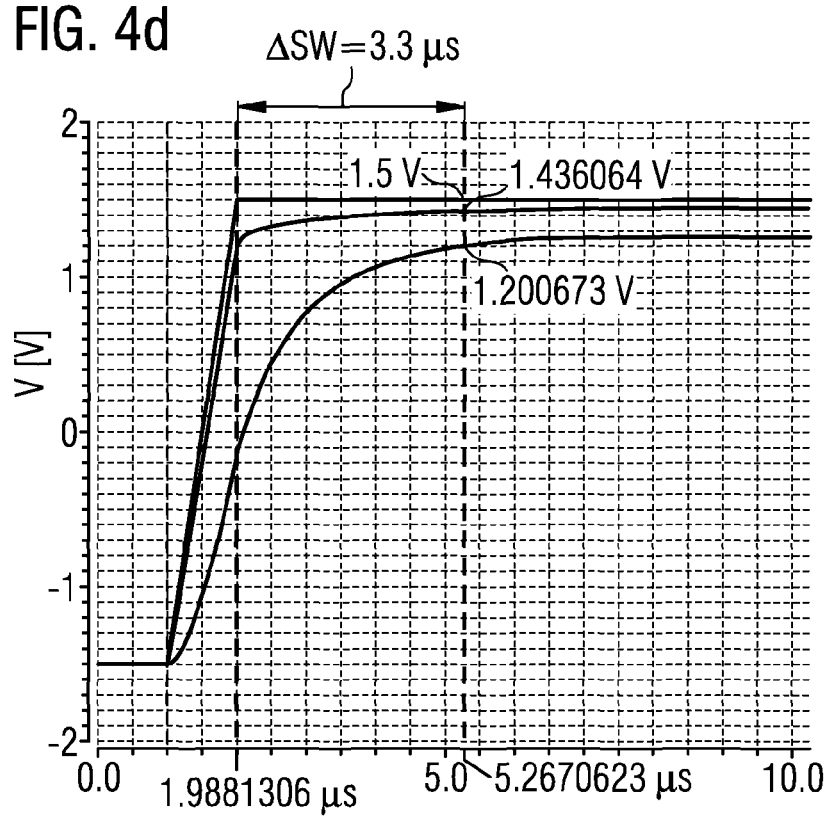

FIG. 4e Switching time for R-2R devices
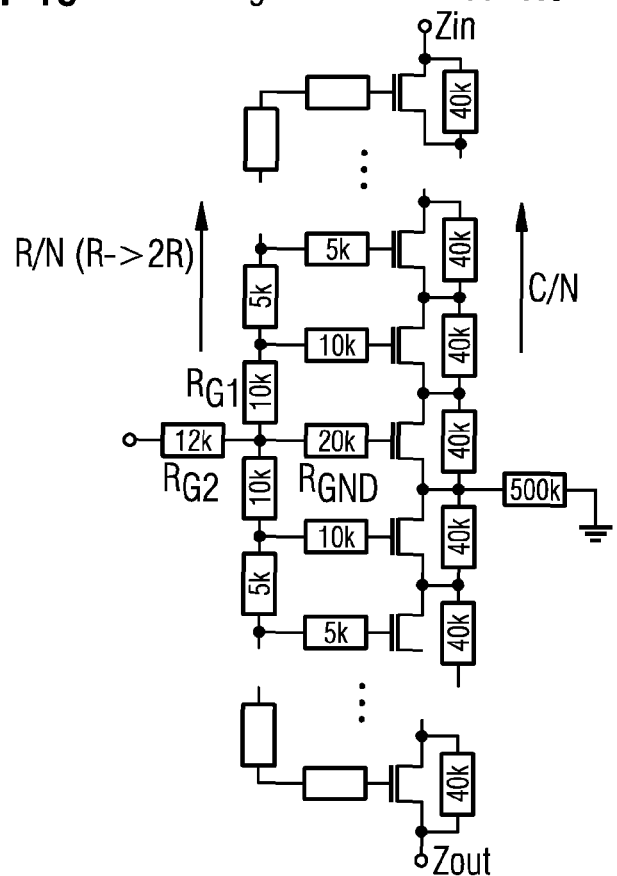
FIG. 4f
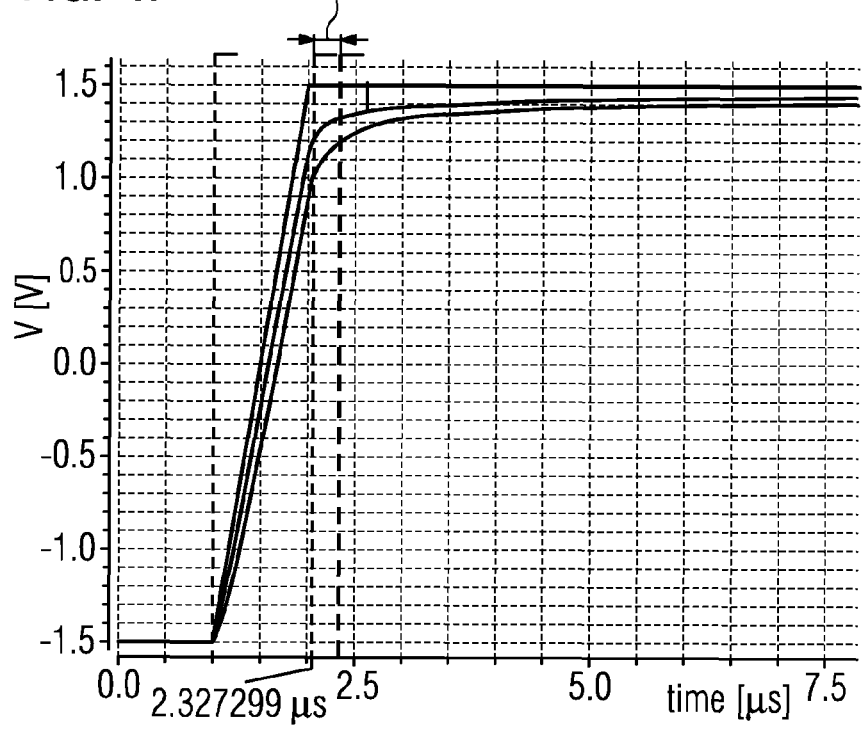

SYSTEM AND METHOD FOR DRIVING RADIO FREQUENCY SWITCH

TECHNICAL FIELD

The present disclosure relates generally to an electronic device, and more particularly to a system and method for driving a radio frequency (RF) switch.

BACKGROUND

RF switches are used in a variety of RF circuits to implement various functions. For instance, an RF system using different signaling methods over different frequencies may be implemented by using a network of antenna switches to select from between different types of RF front-end circuits. One example of such a circuit is a multi-standard cellular telephone that can make calls using different standards such as code division multiple access (CDMA) or Global System for Mobile Communications (GSM). By using an RF switch, an RF front end circuit optimized for CDMA communication may be used for CDMA calls, while and RF front end circuit optimized for GSM communication may be used for GSM calls. In addition, RF switches may be used to implement adjustable matching networks for antennas and power amplifiers, and to provide adjusting tuning for high frequency filters by switching in and out and/or bypassing passive matching and tuning elements.

As RF components are becoming more integrated in fine geometry integrated circuit processes, there are number of technical challenges with respect to fabricating RF switches that have good high frequency performance. One such challenge is handling large voltage swings that may occur during the course of a signal transmission. In some cases, these voltage swings may exceed the breakdown voltages of the particular semiconductor process technology being used. One way in which this challenge is addressed is by stacking multiple devices and/or by using physically larger devices that may better withstand higher voltages. Another challenge to integrating RF switches involves managing the parasitic environment of the RF switch itself, as large devices used to withstand higher voltages may be prone to higher parasitic capacitances that may attenuate and/or degrade an RF signal.

SUMMARY OF THE INVENTION

In accordance with an embodiment, a radio frequency (RF) switching circuit includes a plurality of series connected RF switch cells comprising a load path and a control node, a plurality of first gate resistors coupled between control nodes of adjacent RF switch cells, and an input resistor having a first end coupled to a control node of one of the plurality of RF switch cells and a second end configured to an output of a switch driver. Each of the plurality of series connected RF switch cells includes a switch transistor.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a to 3c illustrate schematics of further embodiment RF switching circuits;

FIGS. 4a to 4f illustrate schematics of various RF switching circuits and corresponding waveform diagrams;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context: a system and method for driving a radio frequency (RF) switch. The invention may also be applied to other systems and applications including other circuits that utilize switches for high frequency applications such as wireless and wireline communication systems, radar systems, and in circuits such as oscillators, receive/transmit switches, attenuators, power amplifier bypass circuits, RF matching and RF filter switching in general.

In embodiments of the present invention, an RF switch is implemented using a series connected transistors having load paths coupled in series. The effect of capacitive parasitics is mitigated by using a string of bias resistors coupled between the gates of each of the series connected transistors. In an embodiment, the use of such resistors spreads an applied RF voltage symmetrically over the series connected transistors, reduces power loss in switch biasing circuits, and provides a low off-capacitance for the switch.

In further embodiments, the RF switch also includes gate resistors coupled in series with each RF switching transistor. In some embodiments, the resistances of the bias resistors and the gate resistors are weighted to reduce a spread in transistor turn-on times.

Figure 1A:
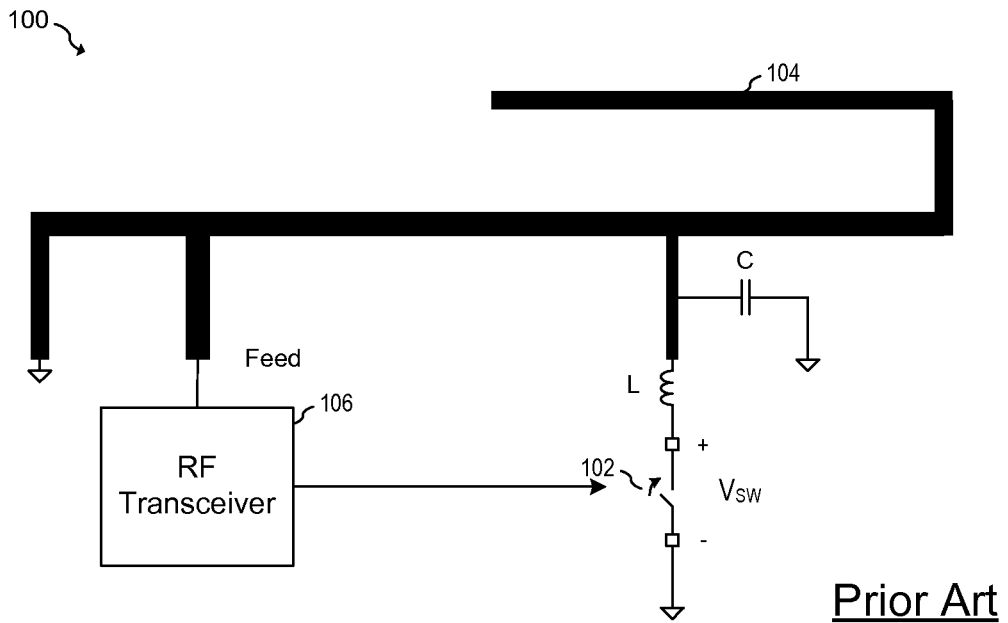
FIGS. 1a to 1f illustrate exemplary RF systems and switching circuits.

FIG. 1a illustrates an exemplary RF system 100 in which an RF transceiver 106 is coupled to a feed line of an Inverted F (IFA) antenna 104 such as may be used in a mobile RF system such as a mobile phone. In addition to RF transceiver 106, antenna aperture tuning shunt switch 102 is coupled to antenna 104 and capacitor C via inductor L to provide tuning to antenna 104. In the illustrated example, only a single shunt switch 102 is shown. However, in various embodiments, multiple switches may be used in conjunction with other passive devices to provide tuning to antenna 104.

During operation of RF system 100, voltage $V_{SW}$ across switch 102 may experience very high voltage swings due to the resonant nature of antenna 104 and its immediate electrical environment. In fact, in some systems, switch voltage $V_{SW}$ may experience RF voltages of about 80 V when RF transceiver 106 transmits 33 dBm of power and switch 102 is open. Accordingly, various measures are taken in the design of switch 102 to withstand such high voltages.

Figure 1B:
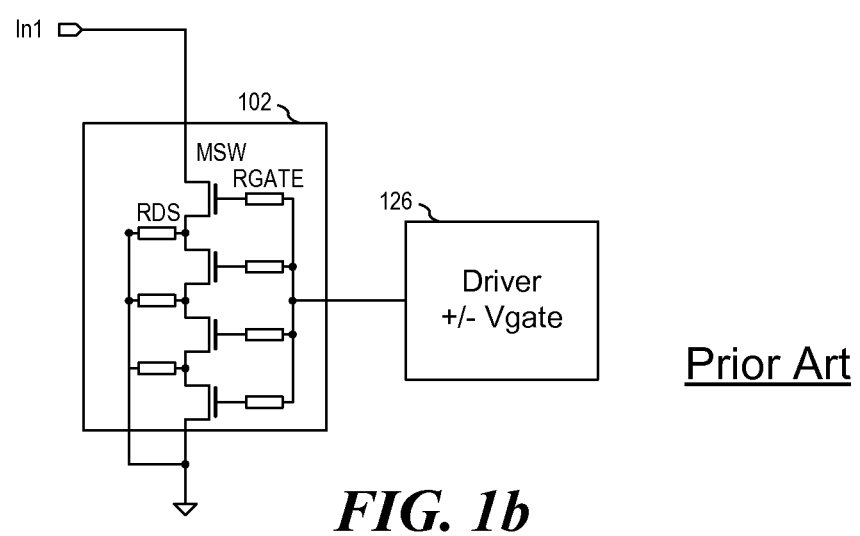

FIG. 1b illustrates a detailed view shunt switch 102 and driver 126. As shown, shunt switch 102 is implemented using a plurality of stacked transistors that are series connected, each transistor MSW of which has a series gate resistor RGATE. Such stacking is used, for example, to prevent breakdown in the presence of high RF voltage swings. As is further shown, the common source/drain nodes of the transistors MSW are coupled to ground via resistors RDS. In one example, embodiment resistors RDS may be about 400 kΩ, however, other values may be used. The switch circuit may be implemented using FET transistors in a CMOS-Bulk, CMOS-SOI using think or thick film silicon on insulator (SOI), GaAs-HEMTs, or other FET transistor type technology. In some cases, PIN Diodes may also be used. As shown, transistor MSW is implemented using an NMOS device, however, transistor MSW may be implemented using a PMOS device, or other transistor type.

During operation, driver 126 provides a negative voltage to the gates of transistors MSW within switch 102 in order to isolate node In1 from ground by turning transistors MSW off. To provide a conductive path from node In1 to ground, a positive voltage is applied to the gates of transistors MSW within switch 102 in order to turn transistors MSW on. In some embodiments, additional DC blocking capacitors (not shown), may be coupled to input node In1 to ensure a symmetric RF swing. Such DC blocking capacitors are utilized, for example, when a DC voltage is present on the RF line. In some embodiments where there is no DC voltage on the RF line, DC blocking capacitors are not used. For switches that do not have a negative bias on the MOS transistors, DC blocking is typically used. Such situations may occur, for example in systems in which the gate of a transistor is being switched between a positive voltage and ground, as is commonly the case with circuits implemented using GaAs HEMT switch technologies. It should be further understood that the polarity of the activation and deactivation voltages may be different when other transistor types besides NMOS devices are used. For example, in embodiments that utilize PMOS devices, the activation voltage may be lower than the deactivation voltage.

Figure 1C:
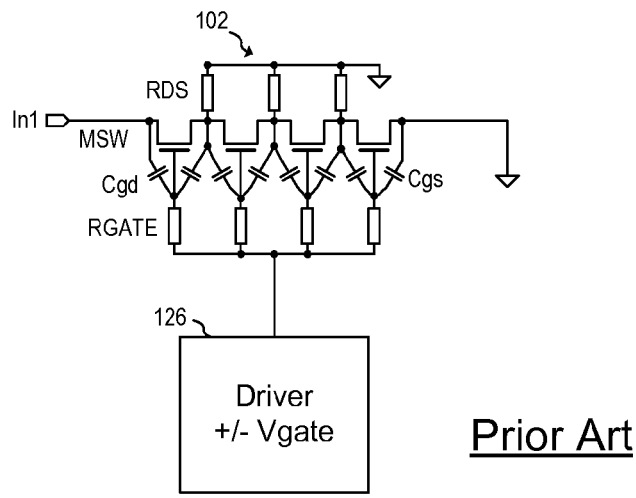

FIG. 1c is shows switch 102 and corresponding driver 126, where transistors MSW are further annotated with parasitic gate-drain capacitances Cgs and gate-source capacitances Cgs. When switch 102 is off, the series combination of parasitic capacitances Cgs and Cgd spread the RF signal present on either input node In1 homogenously over transistors MSW. To prevent distortion of the RD signal, the resistance of RGATE and RDS are selected to be high enough to ensure that capacitances Cgs and Cgd appear as series connected capacitances to prevent parasitic loading at input node In1 and output node Out. Example values for RGATE and RDS are 400 kΩ and 400 kΩ respectively; however, other values may be used. Under non-ideal conditions, however, the amount of isolation afforded by resistors RGATE is limited by the parasitic capacitances associated with resistors RGATE.

Figure 1D:
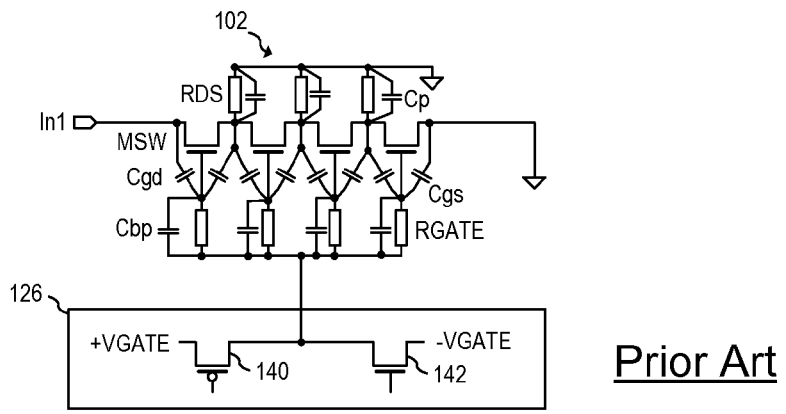

FIG. 1d illustrates switch 102 in which the shunt parasitic capacitance of each gate resistor RGATE is represented by capacitance Cbp and the shunt capacitance of resistor RDS represented by capacitance Cp. In addition, driver 126 is shown being implemented using PMOS switch transistor 140 to couple positive voltage +VGATE to gates of transistors MSW to turn on switch 110, and using NMOS switch transistor 142 to couple negative voltage −VGATE to the gates of transistors MSW to turn off switch 110.

Parasitic capacitances Cbp and Cp may result from non-idealities of the physical implementation of resistor RGATE. For example, when resistor RGATE and/or RDS is implemented using polysilicon disposed on top of the substrate, there will be a small amount of bypass capacitance. For example, depending on the particular resistor layout, a 400 kΩ may have a 2 fF bypass capacitance. At 1 GHz, a 2 fF capacitance corresponds to a capacitive impedance of 80 kΩ, thereby lowering the total effective impedance of RGATE at 1 GHz. It should be appreciated that this is just one particular example of a physical resistor. Other embodiment resistors may have different resistor values and/or different parasitic capacitances associated with it.

When multiple transistors are stacked, the effect of the parasitic capacitance of resistor RGATE on device isolation is further exacerbated. For example, in one embodiment, 40 transistors are stacked in a series configuration in a 1.5 V device technology in order to handle RF voltage swings of about 60 V. Each of these 40 transistors has a series gate resistor associated with it. When the switch is turned off, the parallel combination of 40 gate resistors along with its associated parasitic capacitance further lowers the effective impedance that isolates the gate of the transistors when the transistors are turned off. With respect to the previous example, stacking 40 devices that each has an associated 400 kΩ resistor with 2 fF of parasitic capacitance creates an effective impedance of a 20 kΩ resistive impedance coupled in parallel with a 2 kΩ capacitive impedance, which provides very little gate isolation when the switch transistors are turned off.

Inverter type drivers, such as the implementation shown using transistors 140 and 142, provide a very low impedance to the gates of transistors MSW of switch 110. In some implementations, this low impedance may appear as an RF ground. Moreover, when a low impedance is applied to the parasitic capacitances Cgs and Cgs, the parasitic capacitance seen at input node Iin1 and output node Out is further increased due to the effect of parasitic capacitance Cbp adding in parallel. This parasitic capacitance seen at input node Iin1 and output node Out increases as more transistors are stacked and as the widths of transistors MSW are increased. Thus, the RON*Coff figure of merit commonly used for RF switches is degraded as because of Cbp lowers the impedance of the gate resistors RGATE.

Figure 1E:
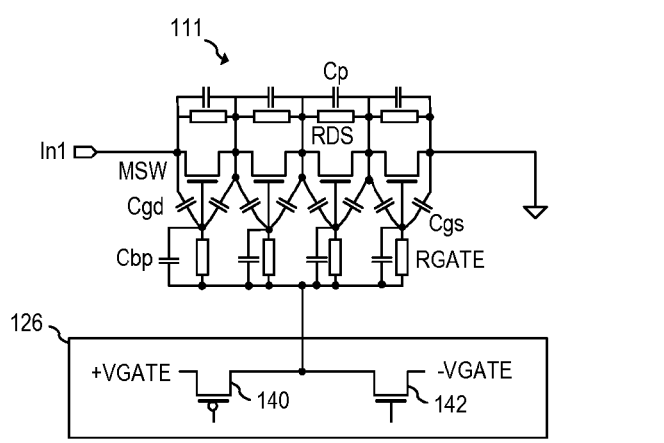

FIG. 1e illustrates switch 111 in which resistances RDS are coupled in parallel with the source/drain connections of transistors MSW instead of being coupled from a source/drain connection to ground. Such a configuration may be used for stacking more devices than the embodiment of FIG. 1d. The value of RDS in this case may in the range of between about 20 kΩ and about 40 kΩ; however, other value outside of this range may be used depending on the particular application and its specifications. Again the shunt parasitic capacitance of each gate resistor RGATE is represented by capacitance Cbp and the shunt capacitance of resistor RDS represented by capacitance Cp. In such a circuit, the source/drain connections are biased to ground via an extra resistor (not shown) coupled to ground or by a switch input coupled to ground.

Figure if illustrates an embodiment switch 150 in which common resistor $R_{G2}$ is coupled between signal source 152 and series gate resistors $R_{G1}$. By coupling a common resistor $R_{G2}$ in series with signal source 152, the capacitive impedance seen at the output of the RF switch may be significantly reduced. The additional common resistors $R_{G2}$, however may slow down the switching time of the switch. This switching time may be derived as follows. The gate current of each transistor can be expressed as:

$$\frac{i}{N} = C_{GS} \cdot \frac{dV_C}{dt}, \quad (1)$$

where i is the total current produced by signal source 152, N is the number of stacked transistors, $C_{GS}$ is the gate-source capacitance of each stacked transistor and $V_C$ is the voltage across each gate-source capacitance. The voltage around the bottom current loop may be expressed as:

$$V_0 = i \cdot R_{G2} + \frac{i}{N} \cdot R_{G1} + V_C, \quad (2)$$

where $V_0$ is the output voltage of signal source 152. Collecting terms and using equation (1) to replace the expression for i/N:

$$V_0 = (N \cdot R_{G2} + R_{G1}) \cdot C_{GS} \cdot \frac{dV_C}{dt} + V_C. \quad (3)$$

Accordingly, the following time constant becomes apparent:

$$\tau = (N \cdot R_{G2} + R_{G1}) \cdot C_{GS}. \quad (4)$$

In switches having a large number of stacked transistors, the common resistance of the multiple gate resistors $R_{G1}$ becomes low, thereby causing a large portion of the RF swing at the output of the switch to be seen across common resistor $R_{G2}$. Moreover, relatively large currents may be conducted through resistances $R_{G1}$ and $R_{G2}$. For example, when a 36 V RF voltage is applied to a 24 transistor stack with $R_{G1}$=100 KΩ and $R_{G2}$=10 KΩ, the parallel combination of 24 $R_{G1}$ resistors is about 4.1 KΩ. In this example, the peak current i produced by signal source 152 is about 3.6 mA, which produces a power dissipation about 35 mW, which may thermally stress the resistors in some cases depending on the particular material used to implement the resistors.

Figure 2A:
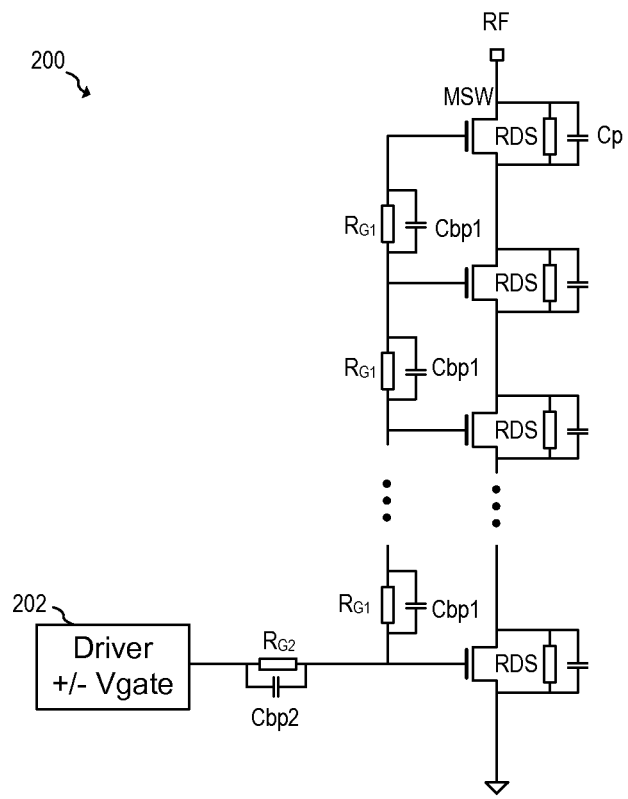
FIGS. 2a and 2b illustrate schematics of embodiment RF switching circuits.

FIG. 2a illustrates an RF switch system 200 according to an embodiment of the present invention. As shown, resistors $R_{G1}$ are now coupled between adjacent gates of transistors MSW and coupled to driver circuit 202 via common resistor $R_{G2}$. In the figure, the parasitic capacitance of drain-source resistor RDS is represented as capacitance Cp, the parasitic capacitance of resistors $R_{G1}$ is represented as capacitance Cbp1, and the parasitic capacitance of resistors $R_{G2}$ is represented as capacitance Cbp2.

In an embodiment, the total resistance to the output of driver 202 becomes Roff=$N \cdot R_{G2}+R_{G1}$, which increases with the number of stacked transistors MSW. Thus, even for low values of $R_{G1}$ such as 20 KΩ a high applied RF voltage at node RF is split over the high series resistance of Roff thereby enabling low power dissipation in resistors $R_{G1}$ and $R_{G2}$. In some embodiments, each resistor $R_{G1}$ sees a same voltage difference, such that the voltage drop over each resistor is about VRF/N, wherein VRF is the applied RF voltage.

In various embodiments, the resistors parasitic bypass capacitance Cpb1 of resistors $R_{G1}$ is divided by the stack instead of accumulating. Accordingly, RF switch system 200 may have a lower capacitance across the switch than the embodiment of FIG. 1f. In some cases, lower capacitance leads to lower high frequency losses during operation.

In terms of ESD performance, the structure of RF switch system spreads an applied RF voltage more evenly across all transistors MSW, thereby enabling the switch to withstand applied RF voltages of higher amplitude as well as larger ESD pulses. In some embodiments, RF switch system 200 may be configured to withstand an ESD pulse of at least 1.5 kV.

Figure 2B:
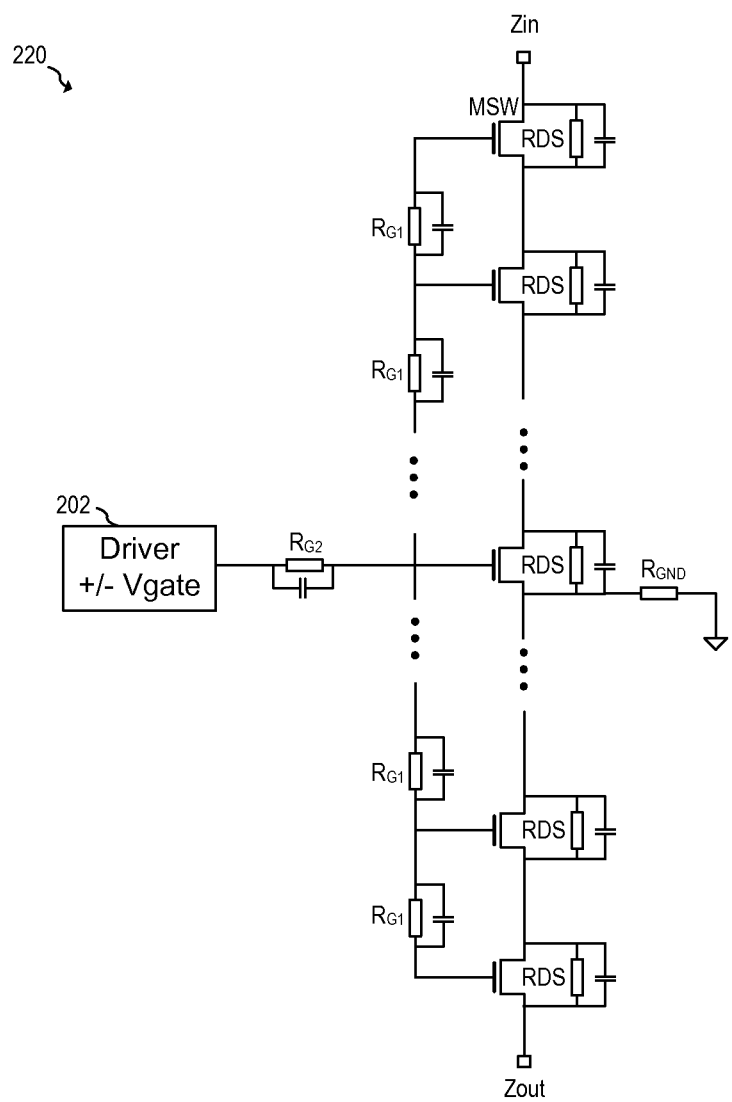

FIG. 2b illustrates RF switching system 220 according to a further embodiment of the present invention. As shown, driver 202 is coupled to the RF switch via resistors $R_{G2}$ at a point in the middle of the transistor stack instead of at a first transistor with respect to FIG. 2a. In some embodiments, resistor $R_{G2}$ may be symmetrically coupled to a center tap of the series combination of resistors $R_{G1}$ such that there are an equal number of resistors $R_{G1}$ coupled to each side of the center tap. Alternatively, resistor $R_{G2}$ may be coupled to a point that is not symmetrically located between an equal number of resistors $R_{G1}$. By coupling driver 202 to a transistor MSW that is in the middle of the chain of switching transistors, maximum rise time, as well as the spread between the fastest and slowest rise times may be reduced. This is because maximum total resistance from the output of driver 202 to the farthest end transistor is reduced. In an embodiment, resistor $R_{GND}$ may be coupled between a source/drain of one of the series connected transistors to ground in order to provide a bias voltage to the transistors when RF switch 220 is turned off, for example, when DC coupling capacitors are used.

FIG. 3a illustrates a further embodiment RF switch 300 in which resistors $R_{G3}$ in series with the gates of the switch transistors are added in addition to resistors $R_{G1}$ and resistor $R_{G2}$ as described in the embodiment of FIG. 2b above. The addition of resistors $R_{G3}$ has the effect of decoupling the gate capacitance of the switch transistors from resistors $R_{G1}$ and resistor $R_{G2}$, thereby allowing for the possibility of faster rise times. In some embodiments, resistors $R_{G1}$ and $R_{G3}$ that are coupled closer to resistor $R_{G3}$ have a higher value than resistors $R_{G1}$ and $R_{G3}$ that are coupled farther from resistor $R_{G2}$. Such a configuration may be used, for example, to align the turn-on delay of the switch transistors. In one embodiment, an R-2R ladder configuration may be applied in order to better align the rise-time of the switch transistors. In the illustrated example, resistor $R_{G3}$ that is connected to the gate of center transistor M0 has a value of 2R, while resistor $R_{G1}$ and the next immediately adjacent resistor $R_{G3}$ have values of R. The resistance of the next two resistors $R_{G1}$ and $R_{G3}$ have a value R/2 that is one-half the previously value of R, and so on down to values of $$\frac{R}{2(n-1)}$$

for resistors $R_{G1}$ and $R_{G3}$ of the $n^{th}$ stage.

FIG. 3b illustrates an embodiment RF switch 320 that has the same structure of RF switch 300 in FIG. 3a, but has example resistor values denoted. For example, $R_{G2}$ has a value of 12 KΩ, and parameter R has a value of 10 KΩ, such that the values of the R-2R ladder formed by resistors $R_{G1}$ and $R_{G3}$ range in value from 20 KΩ to $$\frac{10K}{2(n-1)} \Omega.$$

As is further shown, the resistance of the drain-source resistors are each set to 40 KΩ and resistor $R_{GND}$ is set to 500 KΩ. It should be appreciated that the embodiment of FIG. 3b is just one of many example embodiments. In alternative embodiments, other resistor values could be used besides those shown in FIG. 3b.

Figure 3C:
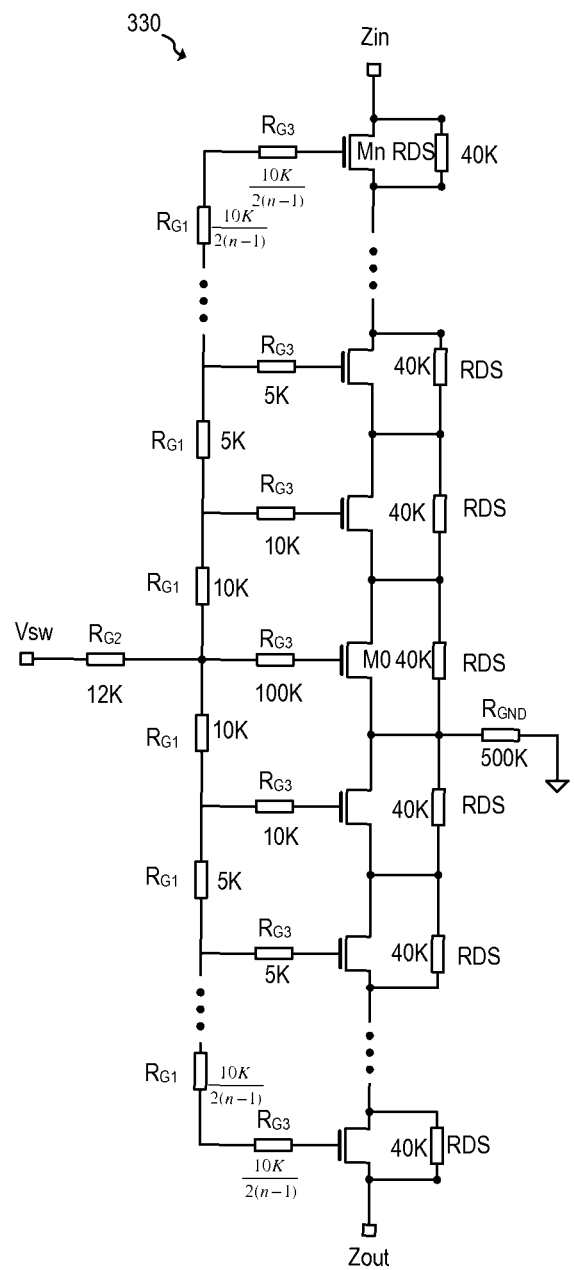

FIG. 3c illustrates an embodiment RF switch 330 that has the same structure of RF switch 300 and similar values with the exception of the resistor coupled in series with the gate of transistor M0, which has a value of 100 KΩ instead of 20 KΩ. By increasing the value of this resistor to 100 KΩ, the skew in delay times for turning on the switching transistors can be reduced. In alternative embodiments, other values may be used instead of 100 KΩ.

Figure 1F:
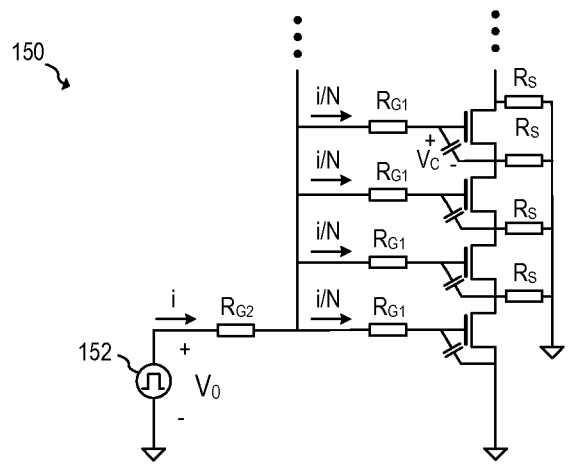

FIG. 4a illustrates a schematic of an RF switch having a similar structure as the embodiment of FIG. 1f, and FIG. 4b illustrates a waveform diagram showing a comparison of the rise time of gate voltages at the input of various transistors. As shown, the resistor values for the RF switch are 12 KΩ for $R_{G2}$, 200 KΩ for $R_{G1}$, 40 KΩ for the source-drain resistors of the switching transistors and 500 KΩ for $R_{GND}$. As shown, the gates of all transistors have reached 80% of its final value within 1.41 μs.

FIG. 4c illustrates a schematic of an RF switch having a similar structure as the embodiment of FIG. 2b, and FIG. 4d illustrates a waveform diagram showing a comparison of the rise time of gate voltages at the input of various transistors. As shown, the resistor values for the RF switch are 12 KΩ for $R_{G2}$, 40 KΩ for $R_{G1}$, 40 KΩ for the source-drain resistors of the switching transistors and 500 KΩ for $R_{GND}$. As shown the 80% rise time of the voltages at the gate of all transistors vary by 3.3 μs.

FIG. 4e illustrates a schematic of an RF switch having a similar structure as the embodiment of FIG. 3b, and FIG. 4f illustrates a waveform diagram showing a comparison of the rise time of gate voltages at the input of various transistors. As shown, the resistor values for the RF switch are 12 KΩ for $R_{G2}$, 40 KΩ for the source-drain resistors of the switching transistors and 500 KΩ for $R_{GND}$, and $R_{G1}$ and $R_{G3}$ form an R-2R ladder with the parameter R being 10 KΩ. As shown the 80% rise time of the voltages at the gate of all transistors vary by 300 ns. It should be understood the performance shown in the waveform diagrams of FIGS. 4b, 4d and 4f are just a few examples of many possible RF switching systems. The rise time of other embodiment systems performance may vary according to the particular embodiment and the device characteristics of the transistors and resistors used to implement the RF switching circuit.

Figure 5A:
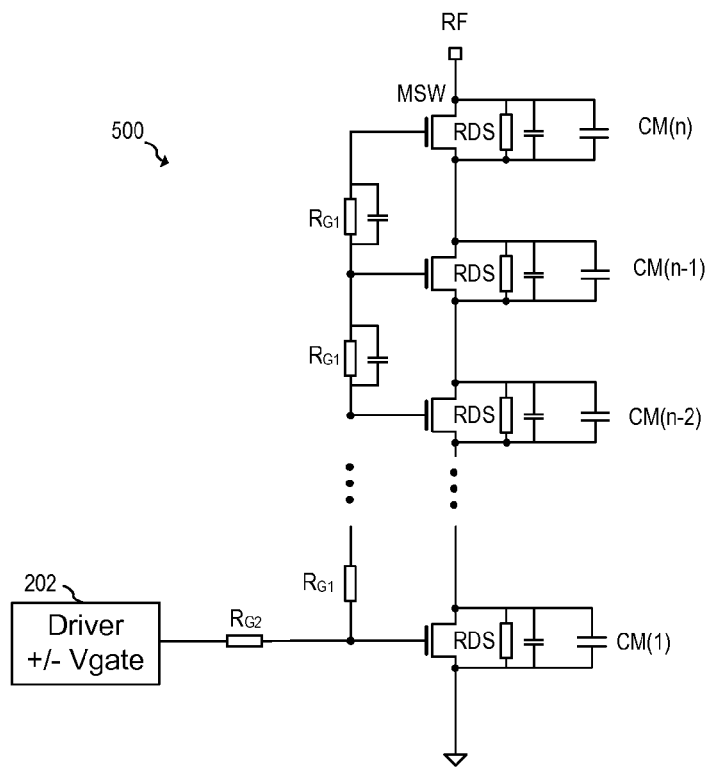
FIGS. 5a and 5b illustrate an embodiment RF switch with capacitive ballasting and a corresponding layout diagram.

FIG. 5 illustrates RF switch 500 according to a further embodiment. As shown, RF switch 500 is similar to the embodiment of FIG. 2a with the addition of capacitors CM(1) to CM(n) coupled in parallel with respective transistors in RF switch 500. These capacitors CM(1) to CM(n) provide capacitive ballasting that helps to equalize the voltage seen across each transistor MSW and may be implemented using capacitor structures known in the art, for example, metal-insulator-metal (MIM) capacitors. In some embodiments, the capacitive parasitics of the $R_{G1}$ resistors may still cause asymmetric voltages across the transistors MSW. For example, when RF switch 500 is off, the applied RF voltage is spread over the gate-source and gate-drain capacitance of the individual switching transistors MSW via capacitive voltage division. Accordingly, parasitic capacitance from the gates of transistors MSW to ground may cause asymmetries in the capacitive voltage division. In such circumstances, individual switching transistors may be exposed to large signals swings, which may cause damage to the devices and/or cause the devices to break down. By using ballast capacitors CM(1) to CM(n), these asymmetries may be equalized by providing reducing the effect of the parasitic capacitances of resistors $R_{G1}$. In one embodiment RF switch 500 includes 67 stacked transistors (n=67) where, capacitor CM(n) has a value of about 3 pF and capacitor CM(1) has a value of about 40 ff, wherein n=67. In some embodiments, the capacitances of CM(n) to CM(1) linearly decrease from 3 pF to 44 ff. Alternatively, the capacitances of CM(n) to CM(1) may decrease in a non-linear manner. It should be further understood that the embodiment of FIG. 5a is just one of many examples of how capacitive ballasting may be applied to embodiment RF switches. In alternative embodiments of the present invention, other capacitor values may be used depending on the particular system, its specifications and the characteristics of the devices used to implement RF switch 500. In some embodiments, resistors $R_{G1}$ may be implemented using metal meandering resistors.

Figure 5B:
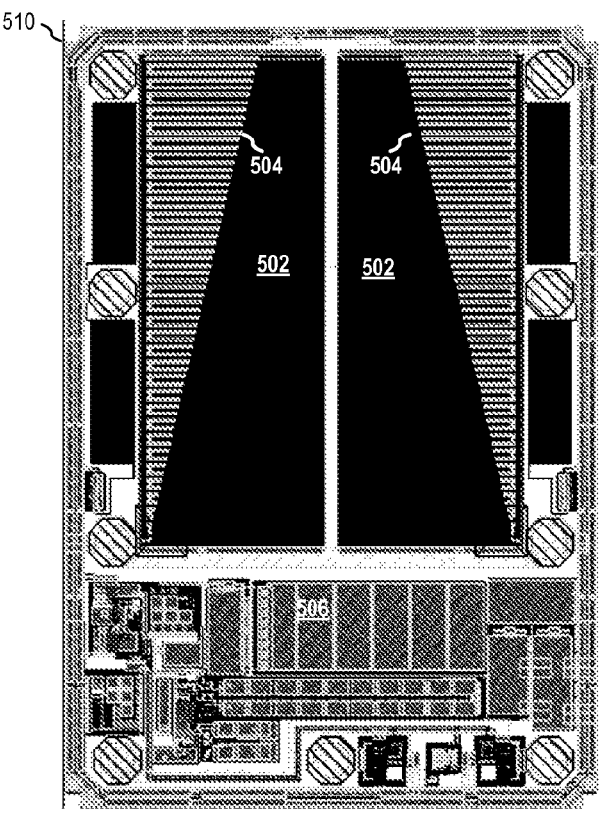

FIG. 5b illustrates a plan view of an integrated circuit layout 510 of the RF switch shown in FIG. 5a. Layout 510 includes switching transistor area 502 and ballast capacitors 504. As shown, the top portion of the layout represents the larger ballast capacitors 504, while the smaller ballast capacitors are located toward the bottom portion of transistor area 502. The lower portion 506 of layout 510 represent various support circuity for the RF switch including charge pumps and switch driver circuits.

Figure 6:
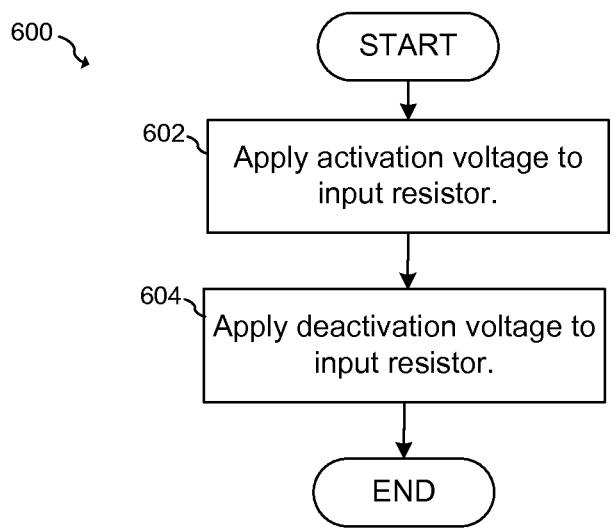
FIG. 6 illustrates a flowchart of an embodiment method.

FIG. 6 illustrates a flowchart 600 of an embodiment method of operating a radio frequency (RF) switching circuit having a plurality of series connected RF switch cells that include a load path and a control node, an input resistor having a first end coupled to a control node of one of the plurality of RF switch cells, and a plurality of first gate resistors coupled between control nodes of adjacent RF switch cells, where each of the plurality of series connected RF switch cells includes a switch transistor. In step 602, the RF switching circuit is turned-on by applying an activation voltage to a second end of the input resistor, where the activation voltage corresponds to an on-voltage of the switch transistors of the RF switch cells. In step 604, the RF switching circuit is turned-off to apply a de-activation voltage to a second end of the input resistor, where the de-activation voltage corresponds to an off-voltage of the switch transistors of the RF switch cells.

Advantages of embodiments of the present invention include the ability to decrease the off-capacitance, increase the ESD performance, and increase the device reliability of RF switches that utilize stacked switching transistors. Other advantages include lower power consumption, lower heating, and lower harmonic generation compared to conventional RF switches. A further advantage includes the ability to equalize the rise time of the gates of the individual RF switching transistors to allow for "hot switching" of devices during operation.

In accordance with various embodiments, circuits or systems may be configured to perform particular operations or actions by virtue of having hardware, software, firmware, or a combination of them installed on the system that in operation causes or cause the system to perform the actions. One general aspect includes a radio frequency (RF) switching circuit including: a plurality of series connected RF switch cells including a load path and a control node, where each of the plurality of series connected RF switch cells includes a switch transistor; a plurality of first gate resistors coupled between control nodes of adjacent RF switch cells; and an input resistor having a first end coupled to a control node of one of the plurality of RF switch cells and a second end configured to an output of a switch driver. Other embodiments of this aspect include corresponding circuits and systems configured to perform the various actions of the methods.

Implementations may include one or more of the following features. The RF switching circuit where each RF switch cell further includes a load path resistor coupled in parallel with the load path of the RF switch cell. The RF switching circuit where the plurality of series RF connected switch cells includes a first terminal coupled to a load path of a first RF switch cell at a first end of the plurality of series connected RF switch cells, and a second terminal coupled to a load path of a last RF switch cell at a second end of the plurality of series connected RF switch cells. In some embodiments, the first end of the input resistor is coupled to the control node of the first RF switch cell. The first end of the input resistor may be coupled to a control node of an intermediate RF switch cell, such that an equal number of RF switch cells are coupled between the intermediate RF switch cell and the first terminal, and between the intermediate RF switch cell and the second terminal.

In some embodiments, each RF switch cell further includes a second gate resistor having a first end coupled to a gate of the switch transistor and a second end coupled to the control node of the RF switch cell. At least a portion of the second gate resistors of the plurality of RF switch cells and at least a portion the plurality of first gate resistors may form an R-2R ladder. Each RF switch cell may further include a load path resistor coupled in parallel with the load path of the RF switch cell; and the RF switching circuit may further include a ground resistor coupled between a load path of one of the RF switch cells and ground. In some embodiments, each RF switch cell further includes a parallel capacitor coupled in parallel with the load path. The parallel capacitor includes, for example, a metal-insulator-metal (MIM) capacitor. In some embodiments, a capacitance of the parallel capacitor of the first RF switch cell is greater than a capacitance of the parallel capacitor of the last RF switch cell. The capacitance of the parallel capacitor linearly decreases from the first RF switch to the last RF switch in some embodiments.

A further general aspect includes a radio frequency (RF) switching circuit including: a first plurality of series connected resistors; a second plurality of shunt resistors having first ends coupled between resistors of the first plurality of series connected resistors; an input coupling resistor having a first end coupled to a center tap of the first plurality of series connected resistors; a plurality of series connected transistors coupled between a first RF switch terminal and a second RF switch terminal, each of the plurality of series connected transistors having control nodes coupled to respective ends of the second plurality of shunt resistors, where a resistance of each of the first plurality of series connected resistors successively decreases from the center tap toward an end of the first plurality of series connected resistors; and a resistance of the each of the second plurality of shunt resistors successively decreases from a first shunt resistor of the second plurality of shunt resistors coupled to the center tap to a first transistor coupled to the first RF switch terminal and successively decreases from the first shunt resistor of the second plurality of shunt resistors coupled to the center tap to a last transistor coupled to the second RF switch terminal. Other embodiments of this aspect include corresponding circuits and systems configured to perform the various actions of the methods.

Implementations may include one or more of the following features. The RF switching circuit further including a third plurality of resistors coupled in parallel to a corresponding load path of each of the plurality of series connected transistors. The RF switching circuit further including a bias resistor having a first end coupled to one of the plurality of series connected transistors and a second end coupled to a reference voltage node. In some embodiments, the first plurality of series connected resistors and the second plurality of shunt resistors form an R-2R ladder.

In an embodiment, a first shut resistor coupled between the center tap and a center transistor of the plurality of series connected transistors includes a first resistance; series resistors of the first plurality of series resistors coupled to the center tap include a resistance of about one-half the first resistance; succeeding series resistors of the first plurality of series resistors immediately adjacent to preceding series resistors include a resistance of about one-half of the preceding series resistors; shunt resistors of the second plurality of shunt resistors immediately adjacent to the first shunt resistor includes a resistance of about one-half the first resistance; and succeeding shunt resistors of the second plurality of shunt resistors immediately adjacent to preceding shunt resistors include a resistance of about one-half of the preceding shunt resistors. In some embodiments, a first shut resistor coupled between the center tap and a center transistor of the plurality of series connected transistors includes a first resistance; series resistors of the first plurality of series resistors coupled to the center tap include a second resistance; succeeding series resistors of the first plurality of series resistors immediately adjacent to preceding series resistors include a resistance of about one-half of the preceding series resistors; shunt resistors of the second plurality of shunt resistors immediately adjacent to the first shunt resistor include the second resistance; and succeeding shunt resistors of the second plurality of shunt resistors immediately adjacent to preceding shunt resistors include a resistance of about one-half of the preceding shunt resistors.

In some embodiments, the RF switching circuit further includes a third plurality of resistors coupled in parallel to a corresponding load path of each of the plurality of series connected transistors; and a bias resistor having a first end coupled to one of the plurality of series connected transistors and an second end coupled to a reference voltage node. The input coupling resistor may have a resistance of about 12 k$\Omega$; the first resistance is about 100 k$\Omega$; the second resistance is about 100 k$\Omega$; each of the third plurality of resistors includes a resistance of about 40 k$\Omega$; and the bias resistor includes a resistance of about 500 k$\Omega$.

The RF switching circuit may further include a driver circuit coupled to a second end of the input coupling resistor. In some embodiments, the RF switching circuit further includes an antenna coupled to at least one of the first RF switch terminal and the second RF switch terminal. The first plurality of series connected resistors, the second plurality of shunt resistors, the input coupling resistor, and the plurality of series connected transistors may be disposed on a single integrated circuit.

Another general aspect includes a method of operating a radio frequency (RF) switching circuit including a plurality of series connected RF switch cells having a load path and a control node, and an input resistor having a first end coupled to a control node of one of the plurality of RF switch cells, and a plurality of first gate resistors coupled between control nodes of adjacent RF switch cells, where each of the plurality of series connected RF switch cells includes a switch transistor. The method includes: turning-on the RF switching circuit including applying an activation voltage to a second end of the input resistor, where the activation voltage corresponds to an on-voltage of the switch transistors of the RF switch cells; and turning-off the RF switching circuit including applying a de-activation voltage to a second end of the input resistor, where the de-activation voltage corresponds to an off-voltage of the switch transistors of the RF switch cells. Other embodiments of this aspect include corresponding circuits and systems configured to perform the various actions of the methods.

Implementations may include one or more of the following features. The method further including applying an RF voltage to a first end of the plurality of series connected RF switch cells, where the RF voltage is substantially evenly distributed across each of the plurality of RF switch cells. The method where: each RF switch cell further includes a second gate resistor having a first end coupled to a gate of the switch transistor and a second end coupled to the control node of the RF switch cell; resistances of the first gate resistors coupled closer to the input resistor are higher than resistances of the first gate resistors coupled farther from the input resistor; resistances of the second gate resistors coupled closer to the input resistor are higher than resistances of the second gate resistors coupled farther from the input resistor; and a rise time at a gate of each transistor is within 20% of each other. system and method for a driving a radio frequency switch.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, embodiment switch drivers could be used to tune oscillators by switching in and out capacitors and other tuning components. Embodiment switch driver circuits may also be applied to receive/transmit switches, attenuators, power amplifier bypass circuits, RF matching, RF filter switching in general, as well as other types of circuits and systems.

What is claimed is:

1. A radio frequency (RF) switching circuit comprising:
   a plurality of series connected RF switch cells comprising a load path and a control node, wherein each of the plurality of series connected RF switch cells comprises a switch transistor and
   an impedance element, wherein an impedance of the impedance element decreases from a first RF switch cell at a first end of the plurality of series connected RF switch cells to a last RF switch cell at a second end of the plurality of series connected RF switch cells, the plurality of series RF connected switch cells comprises a first terminal coupled to a load path of the first RF switch cell at the first end of the plurality of series connected RF switch cells, and a second terminal coupled to a load path of the last RF switch cell at the second end of the plurality of series connected RF switch cells, the impedance element of each RF switch cell-comprises a parallel capacitor coupled in parallel with the load path of the switch transistor of the RF switch cell, and a capacitance of the parallel capacitor of the first RF switch cell is greater than a capacitance of the parallel capacitor of the last RF switch cell, the impedance element of each RF switch cell-comprises a parallel capacitor coupled in parallel with the load path of the switch transistor of the RF switch cell, and a capacitance of the parallel capacitor of the first RF switch cell is greater than a capacitance of the parallel capacitor of the last RF switch cell;
   a plurality of first gate resistors coupled between control nodes of adjacent RF switch cells; and
   an input resistor having a first end coupled to a control node of one of the plurality of RF switch cells and a second end configured to an output of a switch driver.

2. The RF switching circuit of claim 1, wherein each RF switch cell further comprises a load path resistor coupled in parallel with the load path of the RF switch cell.

3. The RF switching circuit of claim 1, wherein the first end of the input resistor is coupled to the control node of the first RF switch cell.

4. The RF switching circuit of claim 1, wherein the first end of the input resistor is coupled to a control node of an intermediate RF switch cell, wherein an equal number of RF switch cells are coupled between the intermediate RF switch cell and the first terminal, and between the intermediate RF switch cell and the second terminal.

5. The RF switching circuit of claim 4, wherein the impedance element of each RF switch cell comprises a second gate resistor having a first end coupled to a gate of the switch transistor and a second end coupled to the control node of the RF switch cell.

6. The RF switching circuit of claim 5, wherein at least a portion of the second gate resistors of the plurality of RF switch cells and at least a portion the plurality of first gate resistors form an R-2R ladder.

7. The RF switching circuit of claim 6, wherein:
   each RF switch cell further comprises a load path resistor coupled in parallel with the load path of the RF switch cell; and
   the RF switching circuit further comprising a ground resistor coupled between a load path of one of the RF switch cells and ground.

8. The RF switching circuit of claim 1, wherein the parallel capacitor comprises a metal-insulator-metal (MIM) capacitor.

9. The RF switching circuit of claim 1, wherein the capacitance of the parallel capacitor linearly decreases from the first RF switch cell to the last RF switch cell.

10. A radio frequency (RF) switching circuit comprising:
    a first plurality of series connected resistors;
    a second plurality of shunt resistors having first ends coupled between resistors of the first plurality of series connected resistors;
    an input coupling resistor having a first end coupled to a center tap of the first plurality of series connected resistors;
    a plurality of series connected transistors coupled between a first RF switch terminal and a second RF switch terminal, each of the plurality of series connected transistors having control nodes coupled to respective ends of the second plurality of shunt resistors, wherein
    a resistance of each of the first plurality of series connected resistors successively decreases from the center tap toward an end of the first plurality of series connected resistors; and
    a resistance of each of the second plurality of shunt resistors successively decreases from a first shunt resistor of the second plurality of shunt resistors coupled to the center tap to a first transistor coupled to the first RF switch terminal and successively decreases from the first shunt resistor of the second plurality of shunt resistors coupled to the center tap to a last transistor coupled to the second RF switch terminal.

11. The RF switching circuit of claim 10, further comprising a third plurality of resistors coupled in parallel to a corresponding load path of each of the plurality of series connected transistors.

12. The RF switching circuit of claim 11, further comprising a bias resistor having a first end coupled to one of the plurality of series connected transistors and a second end coupled to a reference voltage node.

13. The RF switching circuit of claim 10, wherein the first plurality of series connected resistors and the second plurality of shunt resistors form an R-2R ladder.

14. The RF switching circuit of claim 10, wherein:
a first shut resistor coupled between the center tap and a center transistor of the plurality of series connected transistors comprises a first resistance;
series resistors of the first plurality of series connected resistors coupled to the center tap comprise a resistance of about one-half the first resistance;
succeeding series resistors of the first plurality of series connected resistors immediately adjacent to preceding series resistors comprise a resistance of about one-half of the preceding series resistors;
shunt resistors of the second plurality of shunt resistors immediately adjacent to the first shunt resistor comprises a resistance of about one-half the first resistance; and
succeeding shunt resistors of the second plurality of shunt resistors immediately adjacent to preceding shunt resistors comprise a resistance of about one-half of the preceding shunt resistors.

15. The RF switching circuit of claim 10, wherein:
a first shut resistor coupled between the center tap and a center transistor of the plurality of series connected transistors comprises a first resistance;
series resistors of the first plurality of series connected resistors coupled to the center tap comprise a second resistance;
succeeding series resistors of the first plurality connected of series resistors immediately adjacent to preceding series resistors comprise a resistance of about one-half of the preceding series resistors;
shunt resistors of the second plurality of shunt resistors immediately adjacent to the first shunt resistor comprise the second resistance; and
succeeding shunt resistors of the second plurality of shunt resistors immediately adjacent to preceding shunt resistors comprise a resistance of about one-half of the preceding shunt resistors.

16. The RF switching circuit of claim 15, further comprising:
a third plurality of resistors coupled in parallel to a corresponding load path of each of the plurality of series connected transistors; and
a bias resistor having a first end coupled to one of the plurality of series connected transistors and an second end coupled to a reference voltage node.

17. The RF switching circuit of claim 16, wherein:
the input coupling resistor has a resistance of about 12 KΩ;
the first resistance is about 100 KΩ;
the second resistance is about 100 KΩ;
each of the third plurality of resistors comprises a resistance of about 40 KΩ; and
the bias resistor comprises a resistance of about 500 KΩ.

18. The RF switching circuit of claim 10, further comprising a driver circuit coupled to a second end of the input coupling resistor.

19. The RF switching circuit of claim 18, further comprising an antenna coupled to at least one of the first RF switch terminal and the second RF switch terminal.

20. The RF switching circuit of claim 10, wherein the first plurality of series connected resistors, the second plurality of shunt resistors, the input coupling resistor, and the plurality of series connected transistors are disposed on a single integrated circuit.

21. A method of operating a radio frequency (RF) switching circuit comprising a plurality of series connected RF switch cells having a load path and a control node, and an input resistor having a first end coupled to a control node of one of the plurality of RF switch cells, and a plurality of first gate resistors coupled between control nodes of adjacent RF switch cells, wherein each of the plurality of series connected RF switch cells comprises a switch transistor, and the method comprises:
turning-on the RF switching circuit comprising applying an activation voltage to a second end of the input resistor, wherein the activation voltage corresponds to an on-voltage of the switch transistors of the RF switch cells; and
turning-off the RF switching circuit comprising applying a de-activation voltage to a second end of the input resistor, wherein the de-activation voltage corresponds to an off-voltage of the switch transistors of the RF switch cells, wherein
each RF switch cell further comprises a second gate resistor having a first end coupled to a gate of the switch transistor and a second end coupled to the control node of the RF switch cell;
resistances of the first gate resistors coupled closer to the input resistor are higher than resistances of the first gate resistors coupled farther from the input resistor; and
resistances of the second gate resistors coupled closer to the input resistor are higher than resistances of the second gate resistors coupled farther from the input resistor.

22. The method of claim 21, further comprising applying an RF voltage to a first end of the plurality of series connected RF switch cells, wherein the RF voltage is substantially evenly distributed across each of the plurality of RF switch cells.

23. The method of claim 21,
wherein a rise time at a gate of each transistor is within 20% of each other.

* * * * *

UNITED STATES PATENT AND TRADEMARK OFFICE
CERTIFICATE OF CORRECTION

PATENT NO. : 9,742,400 B2
APPLICATION NO. : 14/705518
DATED : August 22, 2017
INVENTOR(S) : Winfried Bakalski It is certified that error appears in the above-identified patent and that said Letters Patent is hereby corrected as shown below:

Column 11, Claim 1, Line 40-67 through Column 12, Line 4 please replace Claim 1 with the following:

1. A radio frequency (RF) switching circuit comprising:
   a plurality of series connected RF switch cells comprising a load path and a control node, wherein each of the plurality of series connected RF switch cells comprises a switch transistor and an impedance element, wherein an impedance of the impedance element decreases from a first RF switch cell at a first end of the plurality of series connected RF switch cells to a last RF switch cell at a second end of the plurality of series connected RF switch cells, the plurality of series RF connected switch cells comprises a first terminal coupled to a load path of the first RF switch cell at the first end of the plurality of series connected RF switch cells, and a second terminal coupled to a load path of the last RF switch cell at the second end of the plurality of series connected RF switch cells, the impedance element of each RF switch cell comprises a parallel capacitor coupled in parallel with the load path of the switch transistor of the RF switch cell, and a capacitance of the parallel capacitor of the first RF switch cell is greater than a capacitance of the parallel capacitor of the last RF switch cell;
   a plurality of first gate resistors coupled between control nodes of adjacent RF switch cells; and
   an input resistor having a first end coupled to a control node of one of the plurality of RF switch cells and a second end configured to an output of a switch driver.

Signed and Sealed this
Tenth Day of April, 2018

Andrei Iancu
*Director of the United States Patent and Trademark Office*